Dec. 23, 1969 R. W. SOSHEA 3,486,086
SURFACE BARRIER SEMICONDUCTOR LIMITER EMPLOYING LOW
BARRIER HEIGHT METALS ON SILICON
Filed July 8, 1966

INVENTOR
RICHARD W. SOSHEA

BY A. C. Smith

ATTORNEY

United States Patent Office 3,486,086
Patented Dec. 23, 1969

3,486,086

SURFACE BARRIER SEMICONDUCTOR LIMITER EMPLOYING LOW BARRIER HEIGHT METALS ON SILICON

Richard W. Soshea, 577 Croyden Court, Sunnyvale, Calif. 94087

Filed July 8, 1966, Ser. No. 563,888
Int. Cl. H01l *11/00, 15/00, 3/00*
U.S. Cl. 317—235 4 Claims

ABSTRACT OF THE DISCLOSURE

A passive semiconductor device uses a metal-semiconductor barrier to limit signal current therethrough for signal voltages impressed across the device in excess of a fraction of a volt.

This invention relates to a semiconductor current limiter and to a method for making the same.

In accordance with the illustrated embodiment of the present invention, a bidirectional semiconductor current limiter is formed from a pair of metal-semiconductor junctions. The current-voltage characteristic exhibits low resistance in a small region within a ±0.1 volt and exhibits very high impedance above these voltage values.

Figure 1:
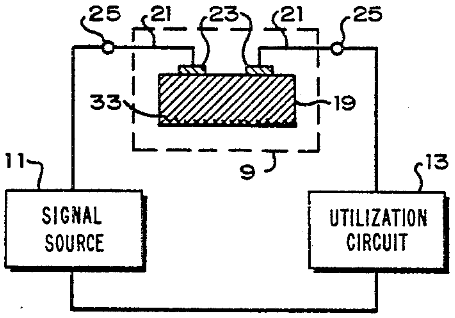
Figure 4:
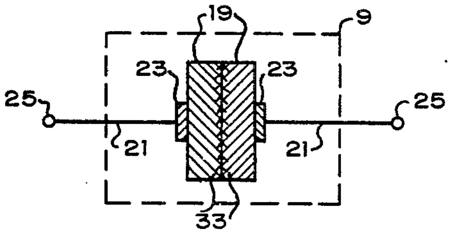
Figure 5:
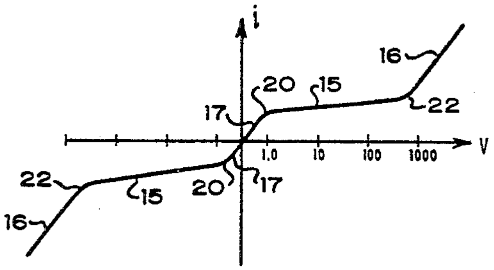

Referring to the drawing, FIGURES 1 through 4 are cross-sectional views of electrically equivalent current limiter structures according to the present invention, FIGURE 5 is a graph of the current-voltage characteristics of the current limiter. In FIGURE 1 there is shown a current limiter device 9 serially connected between a source of signal 11 and a utilization circuit 13. The current limiter 9 of the present invention so connected operates in the very high impedance region 15 (FIGURE 5) and thus limits to a safe value the current supplied to the utilization circuit 13 (say, a sensitive amplifier) upon overloading input from source 11. During operation at normal signal levels, the limiter 9 operates in the low impedance region 17 (FIGURE 5) and thus does not introduce significantly effective impedance in the circuit.

In each embodiment of the present invention shown in FIGURES 1 through 4, two metal-semiconductor barriers are formed on an electrically common body 19 of monocrystalline silicon semiconductor material. Electrical contacts 21 connected to the metal lands 23 on the semiconductor body 19 provide the circuit connection terminals 25 for the current limiter. In each of the embodiments of the invention (except the one shown in FIGURE 2) a region 33 of diffused n-type material such as phosphorus, antimony, arsenic or the like is provided at the surface of the body 19 opposite the surface thereof upon which the metal lands 23 are attached. This n-type impurity diffusion region forms a low ohmic conductor surface and thus decreases the operating impedance between terminals 25 at low voltage levels.

At low operating voltages, the low origin impedance at low operating voltages is determined primarily by the effective barrier height of the metal on the silicon surface. This barrier height is believed to be related to the difference between the work function of the metal which forms the metal lands 23 and the electron affinity of the silicon, as described in the literature (see, for example, Conduction Properties of the Gold N-Type Silicon Schottky Barrier, D. Kahng, Solid State Electronics, 1963, vol. 6, p. 281, and Fermi Level Position at Semiconduction Surfaces, C. A. Mead and W. G. Spitzer, Physical Review Letters, 1963, vol. 10, p. 471). The origin impedance is also related to the area of the junction formed between these metal lands and the semiconductor body 19. Where the barrier height of the metal-semiconductor junction is high (e.g. .79 electron volt for gold) as in commercially available diodes, the impedance for operating characteristics about the origin is also high, typically as high as several hundred megohms. Also, the metal selected determines the breakdown current level at the knee 20 of the curve 15–17 i.e. the current limit at which the operating characteristic 15 away from the origin changes slope and also determines the current level at the knee 22 near breakdown. Thus to insure low origin impedance, a metal should be selected which has an effective barrier height on silicon at least less than .7 electron volt. Metals such as chrome (.61 electron volt) or nickel (.64 electron volt) or tungsten (.64 electron volt) or the like are used to form the metal-semiconductor Schottky-barrier junctions on the semiconductor body 19. Also to provide high current conductivity and low impedance about the origin where desired, the area of the metal-semiconductor junction is formed with at least 25 square mil active area and typically may be as high as 100 mil square area where origin impedances of the order of 10 kilohms to 100 kilohms are desired.

FIGURE 5 shows a symmetrical voltage breakdown characteristic 16 at about 1000 volts appearing across the terminals of the device. This voltage at which the breakdown occurs is determined primarily by the resistivity of the semiconductor material forming the metal-semiconductor junction. Thus the semiconductor body 19 prepared as described herein and having a resistivity of about 100 ohms-centimeters exhibits a breakdown characteristic 16 at about 1000 volts. Where the resistivity is as low as 5 to 10 ohm-centimeters, the breakdown characteristic occurs at about 100 volts.

Figure 6:
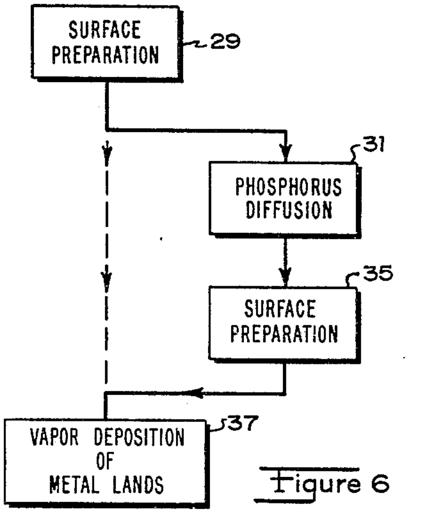

The current limiters according to the present invention may be formed, as in FIG. 6, by etching and polishing the surfaces of a wafer of n-type phosphorus-doped monocrystalline silicon in the resistivity range of about 50 to 150 ohm-centimeters for breakdown voltages of about 1000 volts. These surface preparation procedures 29 may be those which are in common use, for example, including the step of mechanical lapping with an aluminum oxide slurry as an abrasive followed by the step of etching with a mixture of hydrofluoric acid, nitric acid and acetic acid. The wafer may then be cleaned by boiling successively in baths of organic solvents, nitric acid and de-ionized water. For current limiters of the type shown in FIGURES 1, 3 and 4, the etched, polished and cleaned wafers are exposed during step 31 to an atmosphere of phosphorus oxychlorate ($POCl_3$) in a diffusion furnace at a temperature of about 1000° C. for approximately three hours. This diffuses phosphorus in high concentration into the body 9 to provide the low ohmic conduction surface 33.

After this diffusion process, the phosphorus glass formed on the surfaces of the wafer is removed with hydrofluoric acid leaving only the diffused phosphorus layers beneath the surfaces intact. One surface is then etched away and polished during surface preparation step 35 as in the surface preparation step 29 previously discussed in order to remove the phosphorus diffused layer adjacent the one surface, thereby exposing the n-type silicon body with a thickness of about 3 to 5 mils.

Figure 2:
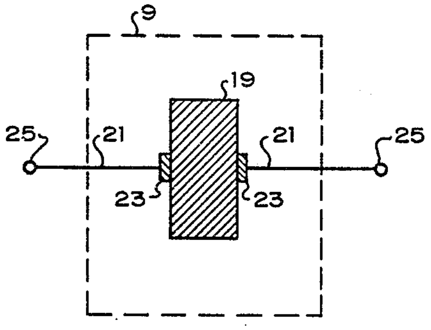
Figure 3:
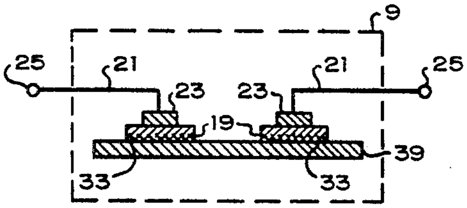

In the embodiment shown in FIGURE 2, the phosphorus diffusion step 31 and surface preparation step 35 may be eliminated so that the metal lands 23 may be deposited on the surfaces of the body following the surface preparation step 29. In either case, a metal such as chrome or nickel or Nichrome alloy or the like may be vapor deposited on one exposed surface of the n-type silicon body 9 (or, as in FIGURE 2, on two surfaces by repeating the vapor deposition step on the opposite surface). This vapor deposition step 37 may be by conventional techniques to form a Schottky-barrier junction using a mask interposed between a metal vapor source and the body 9 to control the area of individual metal lands 23 and to control the spacing between them. Individual bodies 9 having one metal land 23 per body (as in FIGURES 1 and 2) may be sliced from the finished wafers. Contact leads 21 may then be attached to the metal lands 23 to form the individual current limiters 9 (as in FIGURES 1 and 2). The low ohmic conduction surfaces 33 of individual bodies 9 having only one metal land 23 may be electrically connected together as by soldering to a conductive base plate 39 (FIGURE 3) or by soldering such surfaces 33 together directly (FIGURE 4). Of course, where unidirectional current limiting is required, a current limiter may be provided according to the present invention by attaching contact leads 21 only to one metal land 23 and to the ohmic conduction surface 33 of the body 9.

I claim:

1. A semiconductor apparatus comprising:

a body of monocrystalline silicon semiconductor material;

a pair of metal lands, each including a metal having an effective barrier height on said body of silicon not greater than .7 electron volt, attached to said body in spaced apart relationship to form non-ohmic metal-semiconductor junctions; and means including contact leads attached to said metal lands providing electrical connections to said metal-semiconductor junctions.

2. Apparatus as in claim 1 wherein:

said body is monocrystalline, n-type silicon having a resistivity in the range from about 50 to 150 ohm-centimeters; and the area of each of the metal-semiconductor junctions is not less than 25 square mils.

3. Apparatus as in claim 1 wherein:

said body includes first and second substantially opposed major surfaces and is doped with an element from the group consisting of phosphorus, arsenic and antimony;

said metal lands are attached to the same one of the first and second major surfaces of the body; and said body comprises a region of a diffused element selected from the group consisting of phosphorus, arsenic and antimony adjacent the other of the first and second major surfaces of the body to form a low ohmic conductive surface.

4. Semiconductor apparatus as defined in claim 1 wherein:

said body comprising a first portion contiguous one of said pair of metal lands and a second portion contiguous the other of said pair of metal lands, each of said first and second portions comprising a region of diffused phosphorus adjacent the surface of the body portion opposite the metal land for forming a low ohmic conductive surface; and means electrically connecting together said low ohmic conductive surfaces.

References Cited

UNITED STATES PATENTS

| | | | |
|---|---|---|---|
| 2,930,949 | 3/1960 | Roschen | 317—235 |
| 3,290,127 | 12/1966 | Kahng et al. | 29—195 |
| 3,349,297 | 10/1967 | Crowell et al. | 317—234 |

JOHN W. HUCKERT, Primary Examiner

B. ESTRIN, Assistant Examiner

U.S. Cl. X.R.

317—234

UNITED STATES PATENT OFFICE

CERTIFICATE OF CORRECTION

Patent No. 3,486,086 Dated December 23, 1969

Inventor(s) R. W. Soshea

It is certified that error appears in the above-identified patent and that said Letters Patent are hereby corrected as shown below:

In column 1, below the title, after the inventor's name, delete "577 Croyden Court"; after "California", delete -- 94087 -- and substitute -- assignor to Hewlett-Packard Company, Palo Alto, Calif., a corporation of California --.

SIGNED AND
SEALED
JUL 21 1970

(SEAL)
Attest:

Edward M. Fletcher, Jr.
Attesting Officer

WILLIAM E. SCHUYLER, JR.
Commissioner of Patents